US012581723B2

(12) United States Patent
Zou et al.

(10) Patent No.: US 12,581,723 B2
(45) Date of Patent: Mar. 17, 2026

(54) BACKSIDE POWER VIA

(71) Applicant: International Business Machines Corporation, Armonk, NY (US)

(72) Inventors: Lijuan Zou, Slingerlands, NY (US); Tao Li, Slingerlands, NY (US); Feng Liu, Niskayuna, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 394 days.

(21) Appl. No.: 18/362,057

(22) Filed: Jul. 31, 2023

(65) Prior Publication Data

US 2025/0048715 A1    Feb. 6, 2025

(51) Int. Cl.
| | |
|---|---|
| *H10D 84/03* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |
| (Continued) | |

(52) U.S. Cl.
CPC ......... *H10D 84/038* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 84/013* (2025.01); *H10D 84/0135* (2025.01); *H10D 84/0149* (2025.01); *H10D 84/83* (2025.01); *H10W 20/42* (2026.01); *H10W 20/427* (2026.01)

(58) Field of Classification Search
CPC .. H10D 30/014; H10D 30/6735; H10D 30/43; H10D 30/6757; H10D 84/013; H10D 84/83; H10D 84/0135; H10D 84/0149; H10D 84/038; H10D 64/017; H10D 62/121; H01L 21/76895; H01L 21/76897; H01L 21/76834; H01L 23/485; H01L 23/5226; H01L 23/5286
See application file for complete search history.

(56) References Cited

U.S. PATENT DOCUMENTS

| | | | |
|---|---|---|---|
| 9,570,395 | B1 | 2/2017 | Sengupta et al. |
| 9,805,983 | B1 | 10/2017 | Cheng et al. |
| | (Continued) | | |

OTHER PUBLICATIONS

Tao Li, et al., "Self-Aligned Contact Based Via to Backside Power Rail", U.S. Appl. No. 18/173,359, filed Feb. 23, 2023.
(Continued)

*Primary Examiner* — Vongsavanh Sengdara
(74) *Attorney, Agent, or Firm* — CANTOR COLBURN LLP; Samuel Waldbaum

(57) ABSTRACT

Embodiments of the present invention are directed to processing methods and resulting structures for providing power vias through a wafer backside. In a non-limiting embodiment of the invention, a gate and a source or drain (S/D) region are formed on a substrate. A bi-layer liner is formed in a gate cut of the gate. The bi-layer liner includes a first liner on sidewalls of the gate cut and a second liner between the first liner. A top portion of the second liner is replaced with a first portion of a backside power via and the semiconductor device is flipped. A bottom portion of the second liner is replaced with a second portion of the backside power via.

20 Claims, 13 Drawing Sheets

1300

FORM A GATE AND A SOURCE OR DRAIN (S/D) REGION ON A SUBSTRATE
1302

FORM A BI-LAYER LINER IN A GATE CUT OF THE GATE HAVING A FIRST LINER ON SIDEWALLS OF THE GATE CUT AND A SECOND LINER BETWEEN THE FIRST LINER
1304

REPLACE A TOP PORTION OF THE SECOND LINER WITH A FIRST PORTION OF A BACKSIDE POWER VIA
1306

FLIP THE SEMICONDUCTOR DEVICE
1308

REPLACE A BOTTOM PORTION OF THE SECOND LINER WITH A SECOND PORTION OF THE BACKSIDE POWER VIA
1310

(51) Int. Cl.

| | |
|---|---|
| *H10D 84/01* | (2026.01) |
| *H10D 84/83* | (2025.01) |
| *H10W 20/41* | (2026.01) |
| *H10W 20/42* | (2026.01) |

(56) References Cited

U.S. PATENT DOCUMENTS

| | | | |
|---|---|---|---|
| 10,586,765 B2 | 3/2020 | Smith et al. | |
| 10,636,739 B2 | 4/2020 | Beyne et al. | |
| 10,700,207 B2 | 6/2020 | Chen et al. | |
| 10,797,139 B2 | 10/2020 | Morrow et al. | |
| 11,257,764 B2 | 2/2022 | Hiblot et al. | |
| 11,355,601 B2 | 6/2022 | Chiang et al. | |
| 11,362,213 B2 | 6/2022 | Ju et al. | |
| 2020/0105671 A1 | 4/2020 | Lai et al. | |
| 2021/0305252 A1 | 9/2021 | Chiang et al. | |
| 2021/0305381 A1 | 9/2021 | Chiang et al. | |
| 2021/0376093 A1 | 12/2021 | Chu et al. | |
| 2022/0238388 A1 | 7/2022 | Hiblot et al. | |
| 2022/0302268 A1 | 9/2022 | Chiang et al. | |
| 2022/0399334 A1 | 12/2022 | Guler et al. | |
| 2023/0018698 A1* | 1/2023 | Xie | H01L 21/76895 |
| 2023/0046117 A1 | 2/2023 | Tao et al. | |
| 2023/0067354 A1 | 3/2023 | Wei | |
| 2023/0132353 A1* | 4/2023 | Xie | H01L 21/743 |
| | | | 257/288 |
| 2023/0139929 A1* | 5/2023 | Xie | H01L 23/5286 |
| | | | 257/288 |
| 2023/0335444 A1 | 10/2023 | Wang et al. | |
| 2024/0120274 A1* | 4/2024 | Lee | H01L 23/485 |
| 2024/0290657 A1 | 8/2024 | Li et al. | |

OTHER PUBLICATIONS

List of Patents or Patent Applications Treated as Related; Date Filed: Aug. 1, 2023, 2 pages.
Schor, "Intel Announces 20A Node: RibbonFET Devices, PowerVia, 2024 Ramp," WikiChip Fuse, Chips and Semi News, Jul. 26, 2021, 7 Pages. <https://fuse.wikichip.org/news/5943/intel-announces-20a-node-ribbonfet-devices-powervia-2024-ramp/>.

* cited by examiner

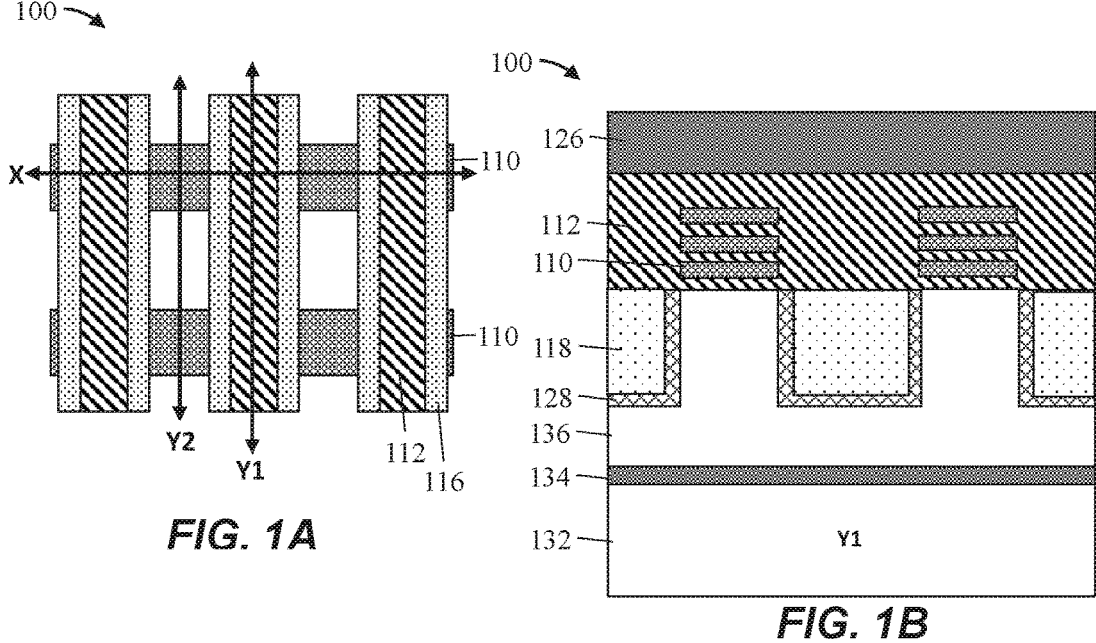
*FIG. 1A*
*FIG. 1B*
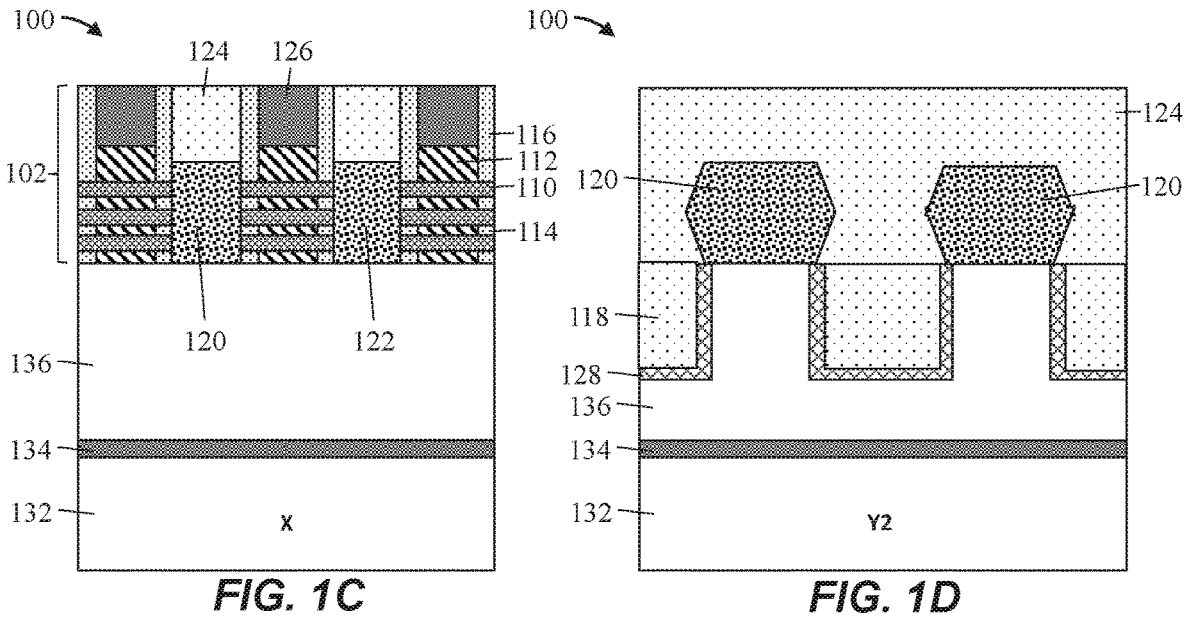
*FIG. 1C*
*FIG. 1D*

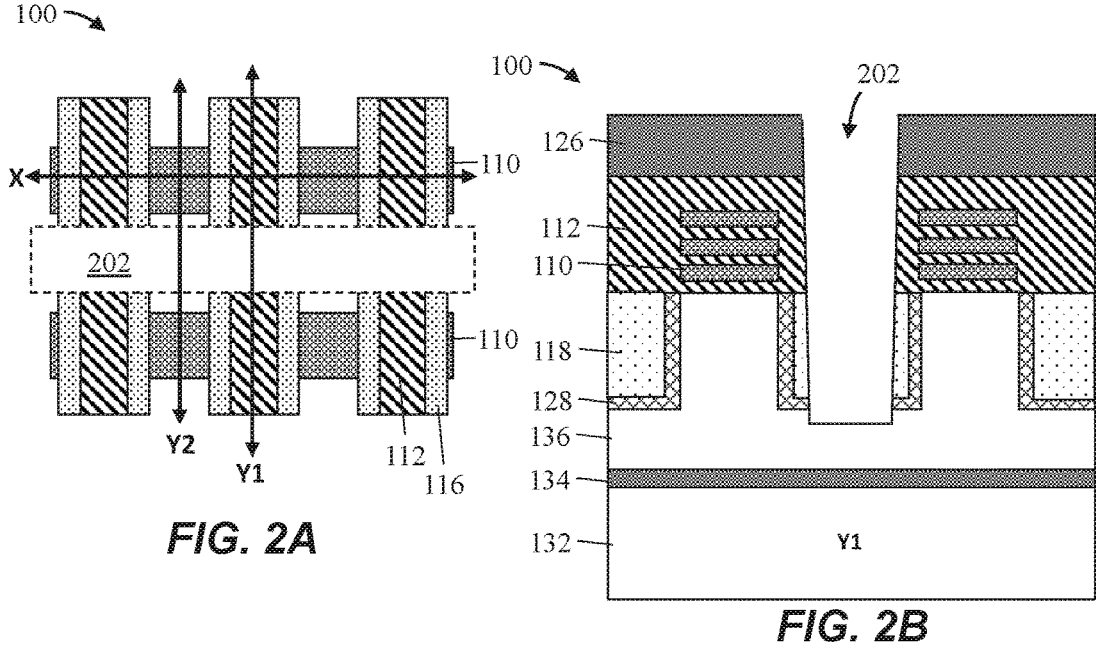
FIG. 2A
FIG. 2B
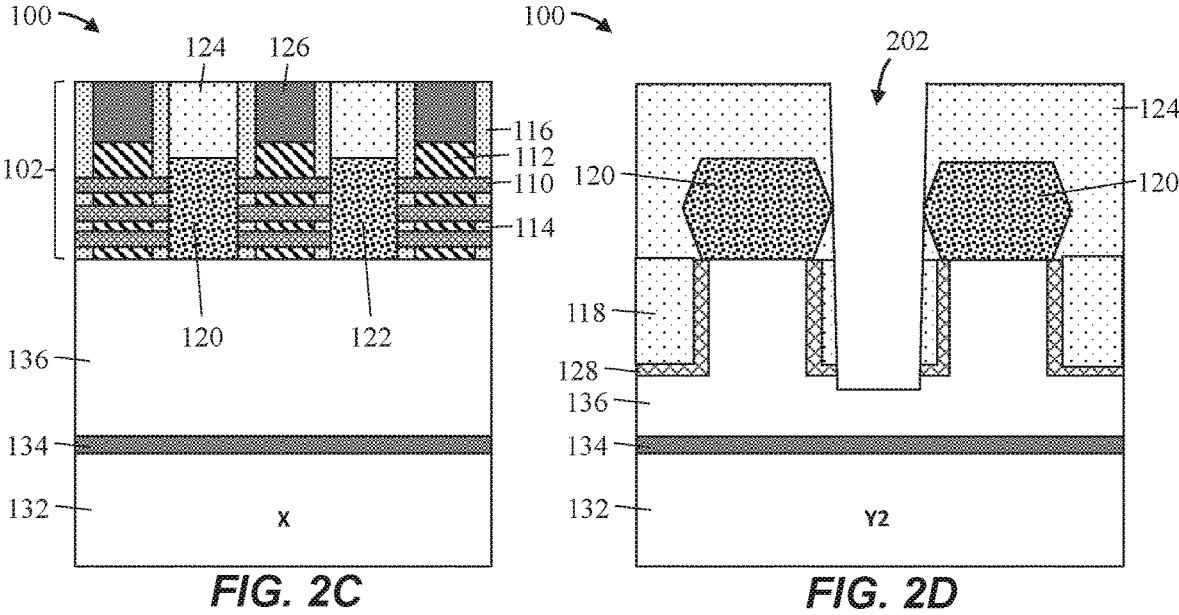
FIG. 2C
FIG. 2D

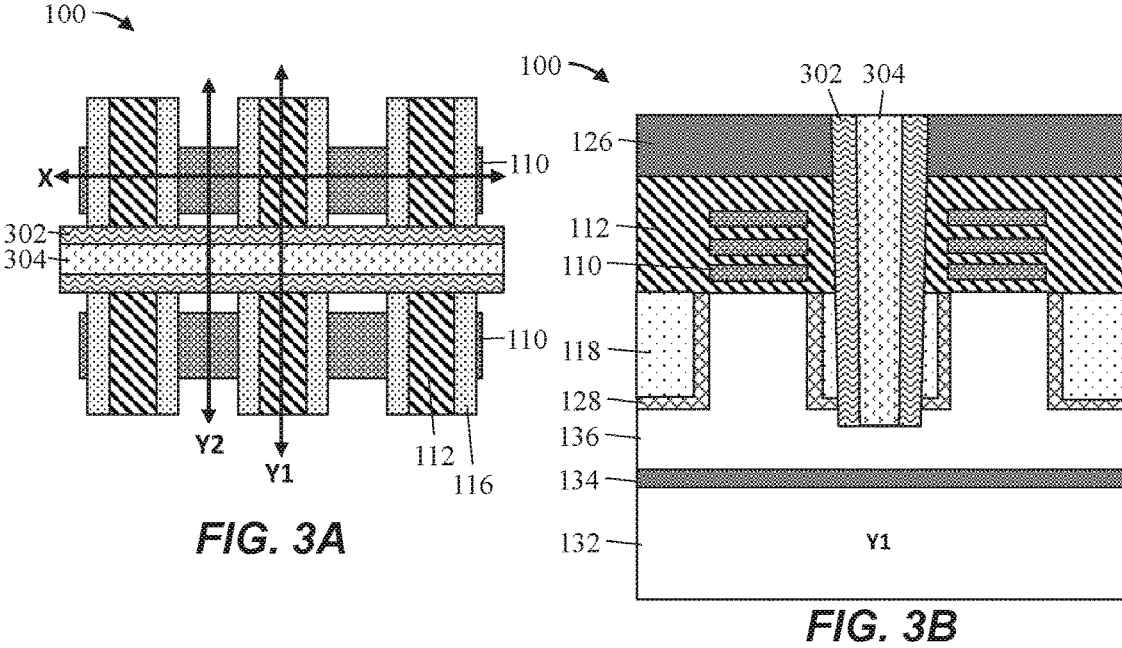
FIG. 3A
FIG. 3B
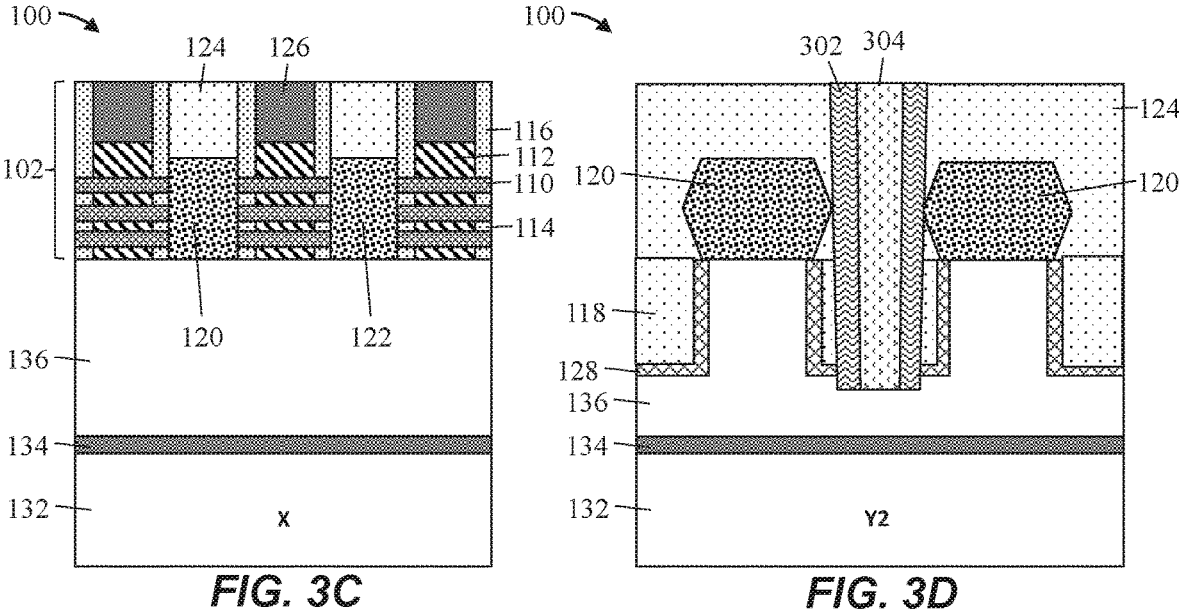
FIG. 3C
FIG. 3D

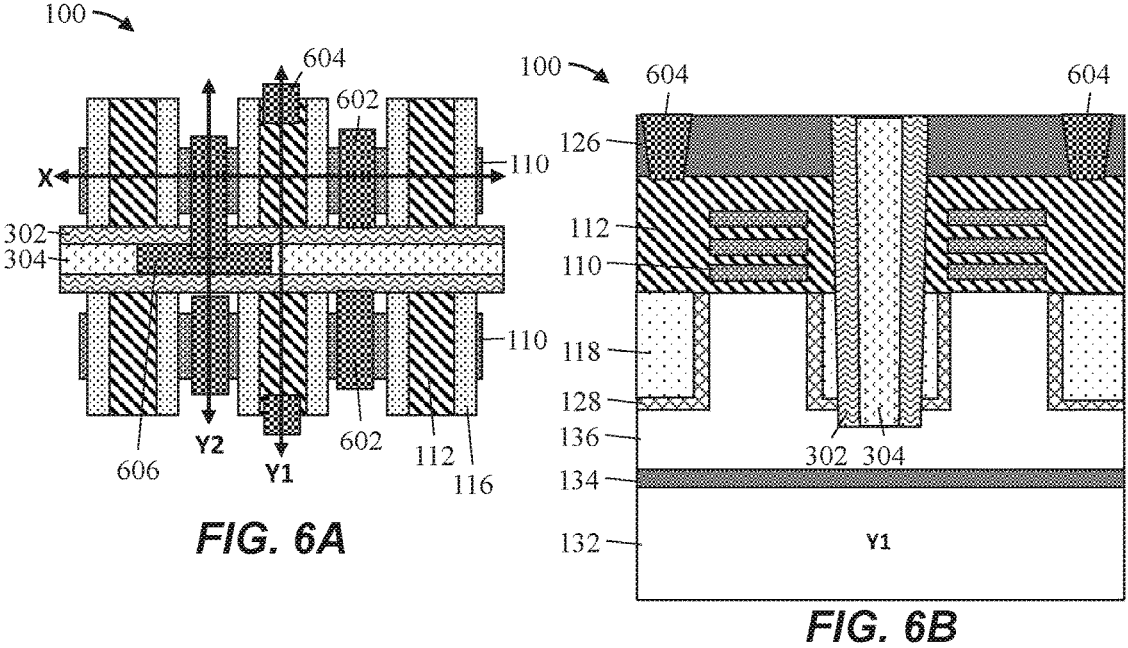
*FIG. 6A*
*FIG. 6B*
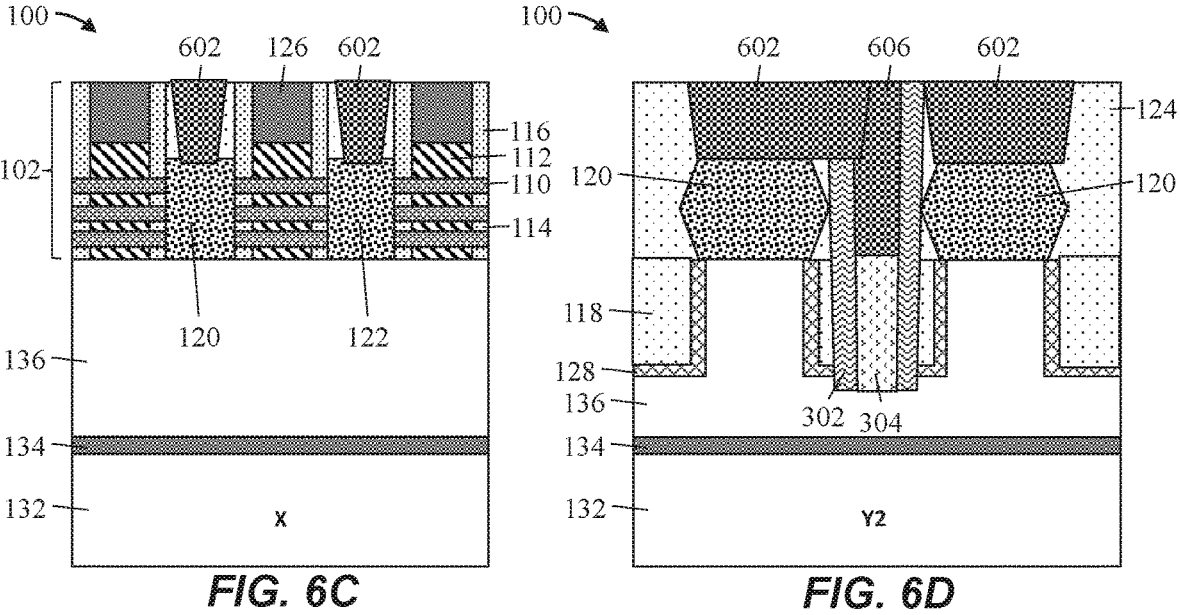
*FIG. 6C*
*FIG. 6D*

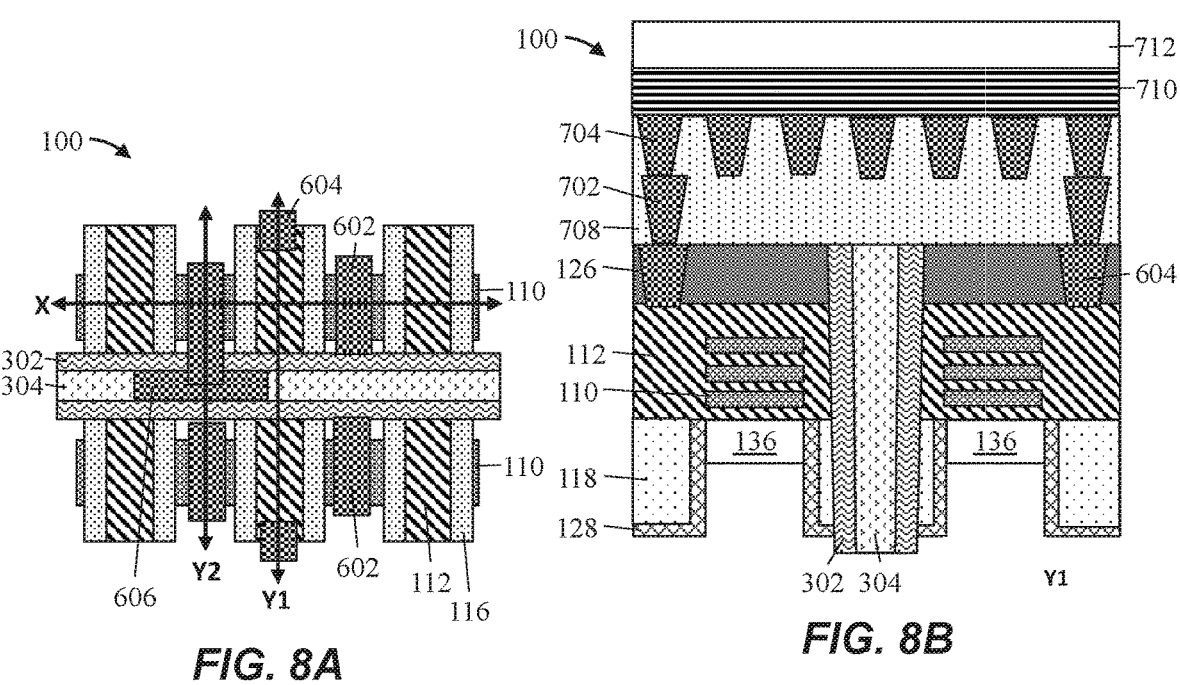
FIG. 8A
FIG. 8B
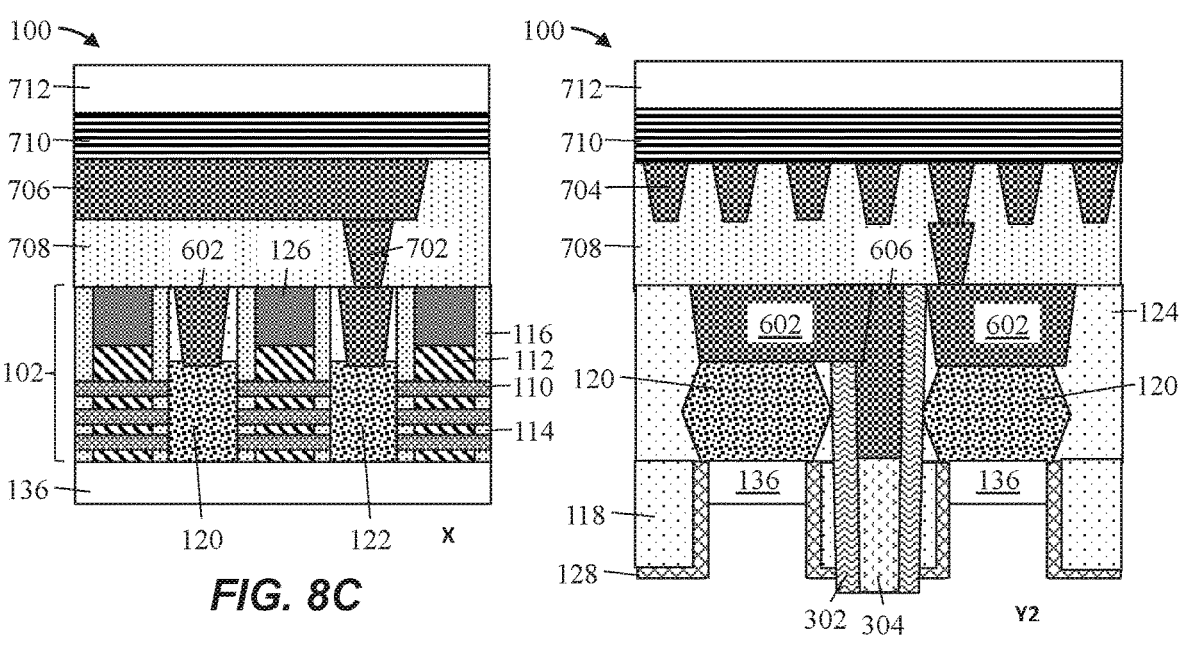
FIG. 8C
FIG. 8D

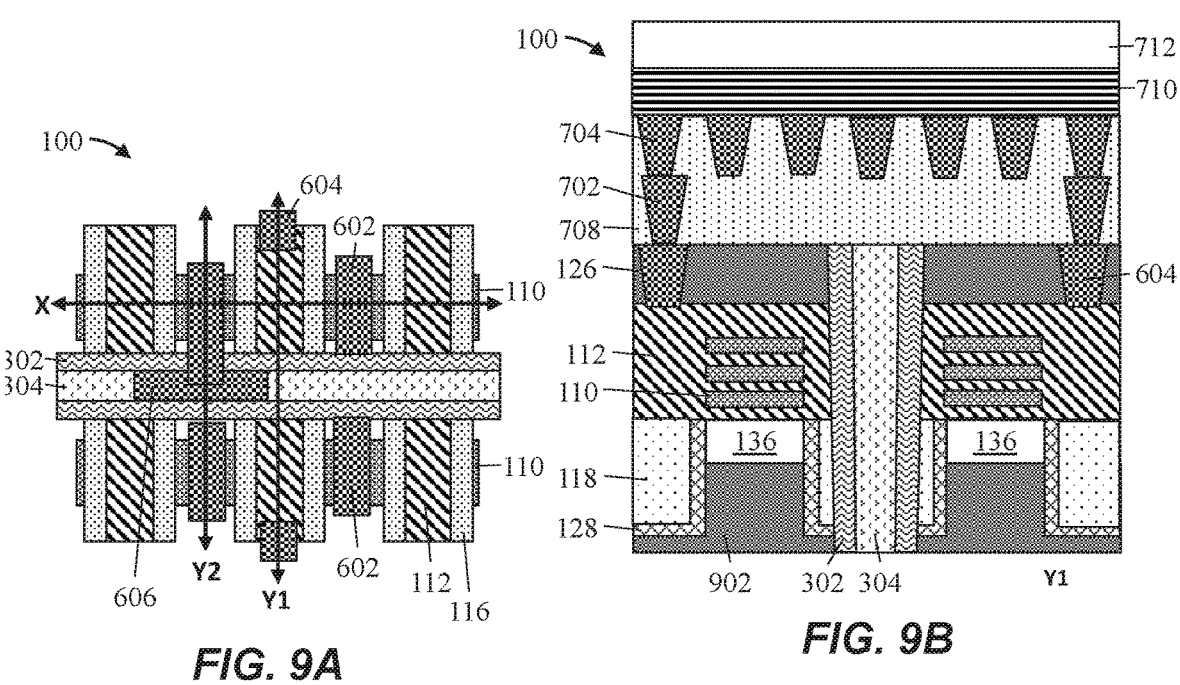
*FIG. 9A*
*FIG. 9B*
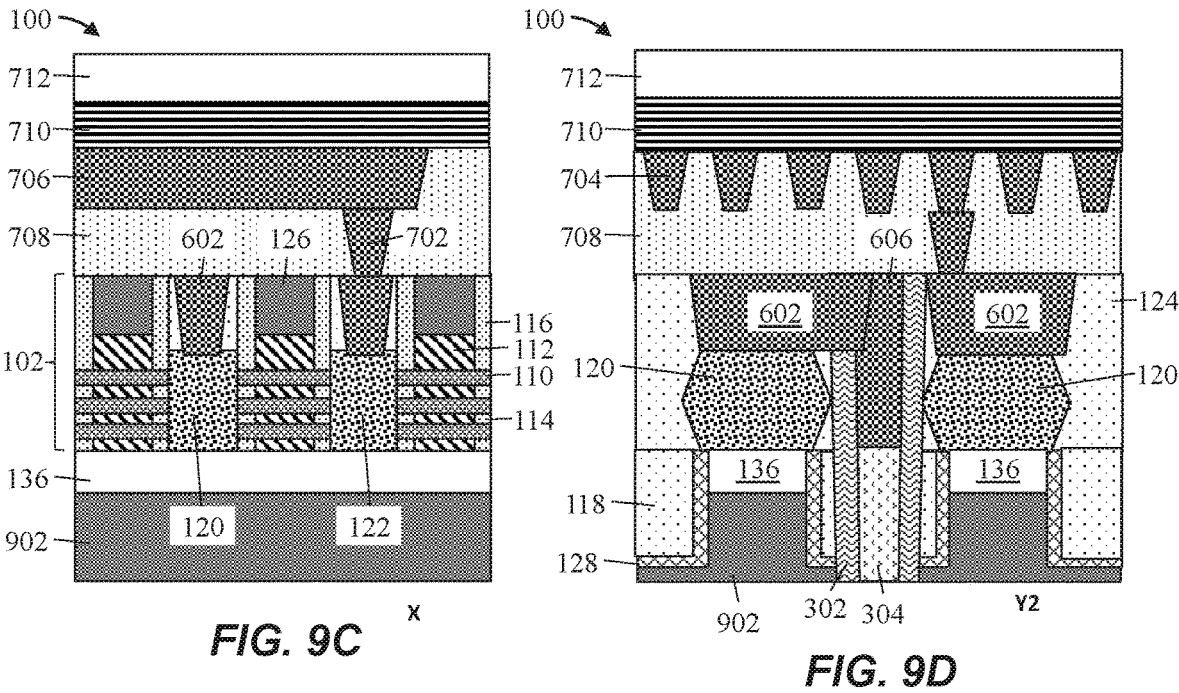
*FIG. 9C*
*FIG. 9D*

1300

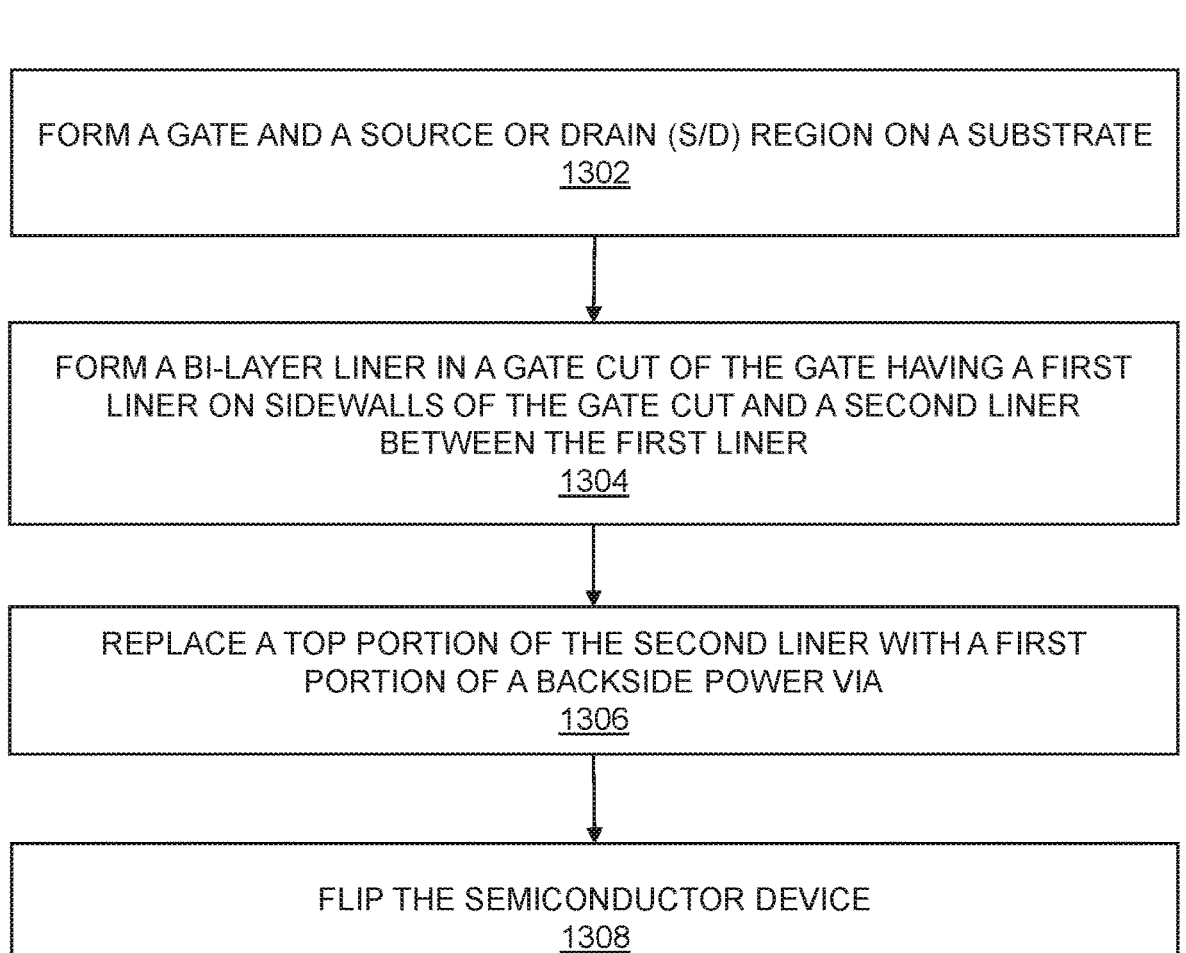

FORM A GATE AND A SOURCE OR DRAIN (S/D) REGION ON A SUBSTRATE
1302

FORM A BI-LAYER LINER IN A GATE CUT OF THE GATE HAVING A FIRST LINER ON SIDEWALLS OF THE GATE CUT AND A SECOND LINER BETWEEN THE FIRST LINER
1304

REPLACE A TOP PORTION OF THE SECOND LINER WITH A FIRST PORTION OF A BACKSIDE POWER VIA
1306

FLIP THE SEMICONDUCTOR DEVICE
1308

REPLACE A BOTTOM PORTION OF THE SECOND LINER WITH A SECOND PORTION OF THE BACKSIDE POWER VIA
1310

*FIG. 13*

BACKSIDE POWER VIA

BACKGROUND

The present invention generally relates to fabrication methods and resulting structures for semiconductor devices, and more specifically, to processing methods and resulting structures for providing power vias through a wafer backside.

The development of an integrated circuit (i.e., chip) involves several stages from design through fabrication. Many aspects of the development are performed iteratively to ensure that the chip ultimately manufactured meets all design requirements. Defining the chip architecture is one of the earliest phases of integrated circuit development. The power (e.g., power requirement), performance (e.g., timing), and area (i.e., space needed) for the resulting chip, collectively PPA, is one of the primary metrics by which integrated circuits are evaluated. PPA is largely a consequence of the chip architecture.

Semiconductor fabrication continues to evolve towards improving one or more aspects of PPA. For example, a higher number of active devices (mainly transistors) of ever decreasing device dimensions are placed on a given surface of semiconductor material. Density scaling has put a strain on the design and fabrication of the interconnects between the front end of line of the integrated circuit, consisting mainly of the active devices, and the contact terminals of the integrated circuit. In many chip architectures, all of these interconnects are incorporated in the back end of line (BEOL) structure of the integrated circuit, which includes a stack of metallization layers and vertical via connections built on top of the front end of line (FEOL) structure.

A key component of the BEOL structure is the power delivery network (PDN). The PDN of an integrated circuit is defined by the conductors and vias connected to the power supply (VDD) and ground (VSS) terminals of the chip. The PDN is responsible for delivering power to the individual devices in the front end. The integration of the PDN in the BEOL has become particularly challenging as device densities continue to scale. Backside power delivery is one known solution to this problem, and involves moving some (or most, or all) layers of the PDN from the front side of the integrated circuit to the back side. In a backside-style architecture, the repositioned layers are not formed on top of the FEOL, but are instead formed on the opposite side of the chip (i.e., on the backside of the semiconductor substrate onto which the active devices have been built).

SUMMARY

Embodiments of the invention are directed to a method for providing power vias through a wafer backside. A non-limiting example of the method includes forming a gate and a source or drain (S/D) region on a substrate. A bi-layer liner is formed in a gate cut of the gate. The bi-layer liner includes a first liner on sidewalls of the gate cut and a second liner between the first liner. A top portion of the second liner is replaced with a first portion of a backside power via and the semiconductor device is flipped. A bottom portion of the second liner is replaced with a second portion of the backside power via. Advantageously, building backside power vias over two stages (pre- and post-wafer flip) in this manner reduces the required RIE depth, reducing resistance, parasitic capacitance, and backside via-to-gate short risk.

In some embodiments, a backside power rail is formed on the second portion of the backside power via. Advantageously, the backside power rail allows for some (or all) of a power delivery network to be repositioned to the backside of a semiconductor device.

In some embodiments, the substrate is recessed. In some embodiments, a dielectric cap is formed on the recessed surface of the substrate. Advantageously, the substrate is electrically isolated from the second portion of the backside power via and the backside power rail by the dielectric cap.

In some embodiments, a S/D contact is formed on the S/D region. The S/D contact in direct contact with the first portion of the backside power via. Advantageously, the S/D contact allows the S/D region to connect, via the backside power via, to the backside power rail.

In some embodiments, replacing the top portion of the second liner with the first portion of the backside power via includes recessing the second liner. Advantageously, the second liner can be recessed in a manner that is self-aligned to the sidewalls of the first liner.

In some embodiments, the first liner of the bi-layer liner includes a first material and the second liner of the bi-layer liner includes a second material that can be removed selective to the first material. Advantageously, the second liner can be recessed and otherwise patterned selective to the first liner.

Embodiments of the invention are directed to a semiconductor structure. A non-limiting example of the semiconductor structure includes a front end of line structure having a gate and a S/D region on a substrate. The front end of line structure further includes a bi-layer liner in a gate cut of the gate. The bi-layer liner includes a first liner on sidewalls of the gate cut and a second liner between the first liner. A top portion of the second liner is replaced with a first portion of a backside power via. The semiconductor structure further includes a back end of line structure on a backside surface of the front end of line structure. The back end of line structure includes a second portion of the backside power via. A bottom portion of the second liner is replaced with the second portion of the backside power via. Advantageously, building backside power vias over two stages (pre- and post-wafer flip) in this manner reduces the required RIE depth, reducing resistance, parasitic capacitance, and backside via-to-gate short risk.

Embodiments of the invention are directed to a semiconductor structure. A non-limiting example of the semiconductor structure includes a front end of line structure having a gate and a S/D region over a first surface of a substrate. The front end of line structure further includes a first liner on sidewalls of a gate cut and a second liner between the first liner. A top portion of the second liner is replaced with a first portion of a backside power via. The semiconductor structure further includes a first back end of line structure over the first surface of the substrate. The first back end of line structure includes a S/D contact on the S/D region. The S/D contact is in direct contact with the first portion of the backside power via. The semiconductor structure further includes a second back end of line structure over a second surface of the substrate opposite the first surface of the substrate. The second back end of line structure includes a second portion of the backside power via. A bottom portion of the second liner is replaced with the second portion of the backside power via. Advantageously, building backside power vias over two stages (pre- and post-wafer flip) in this manner reduces the required RIE depth, reducing resistance, parasitic capacitance, and backside via-to-gate short risk.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1A depicts a top-down view of a semiconductor wafer after an initial set of processing operations according to one or more embodiments of the invention;

FIG. 1B depicts a cross-sectional view taken along the line X (across gate in channel region) in FIG. 1A after the initial set of processing operations according to one or more embodiments of the invention;

FIG. 1C depicts a cross-sectional view taken along the line Y1 (along gate in channel region) in FIG. 1A after the initial set of processing operations according to one or more embodiments of the invention;

FIG. 1D depicts a cross-sectional view taken along the line Y2 (across channel in source/drain region) in FIG. 1A after the initial set of processing operations according to one or more embodiments of the invention;

FIG. 2A depicts a top-down view of the semiconductor wafer after a processing operation according to one or more embodiments;

FIG. 2B depicts a cross-sectional view taken along the line X in FIG. 2A after the processing operation according to one or more embodiments of the invention;

FIG. 2C depicts a cross-sectional view taken along the line Y1 in FIG. 2A after the processing operation according to one or more embodiments of the invention;

FIG. 2D depicts a cross-sectional view taken along the line Y2 in FIG. 2A after the processing operation according to one or more embodiments of the invention;

FIG. 3A depicts a top-down view of the semiconductor wafer after a processing operation according to one or more embodiments;

FIG. 3B depicts a cross-sectional view taken along the line X in FIG. 3A after the processing operation according to one or more embodiments of the invention;

FIG. 3C depicts a cross-sectional view taken along the line Y1 in FIG. 3A after the processing operation according to one or more embodiments of the invention;

FIG. 3D depicts a cross-sectional view taken along the line Y2 in FIG. 3A after the processing operation according to one or more embodiments of the invention;

FIG. 6A depicts a top-down view of the semiconductor wafer after a processing operation according to one or more embodiments;

FIG. 6B depicts a cross-sectional view taken along the line X in FIG. 6A after the processing operation according to one or more embodiments of the invention;

FIG. 6C depicts a cross-sectional view taken along the line Y1 in FIG. 6A after the processing operation according to one or more embodiments of the invention;

FIG. 6D depicts a cross-sectional view taken along the line Y2 in FIG. 6A after the processing operation according to one or more embodiments of the invention;

FIG. 8A depicts a top-down view of the semiconductor wafer after a processing operation according to one or more embodiments;

FIG. 8B depicts a cross-sectional view taken along the line X in FIG. 8A after the processing operation according to one or more embodiments of the invention;

FIG. 8C depicts a cross-sectional view taken along the line Y1 in FIG. 8A after the processing operation according to one or more embodiments of the invention;

FIG. 8D depicts a cross-sectional view taken along the line Y2 in FIG. 8A after the processing operation according to one or more embodiments of the invention;

FIG. 9A depicts a top-down view of the semiconductor wafer after a processing operation according to one or more embodiments;

FIG. 9B depicts a cross-sectional view taken along the line X in FIG. 9A after the processing operation according to one or more embodiments of the invention;

FIG. 9C depicts a cross-sectional view taken along the line Y1 in FIG. 9A after the processing operation according to one or more embodiments of the invention;

FIG. 9D depicts a cross-sectional view taken along the line Y2 in FIG. 9A after the processing operation according to one or more embodiments of the invention;

FIG. 13 depicts a flow diagram illustrating a method according to one or more embodiments of the invention.

Figures 4A, 4B, 4C, 4D:
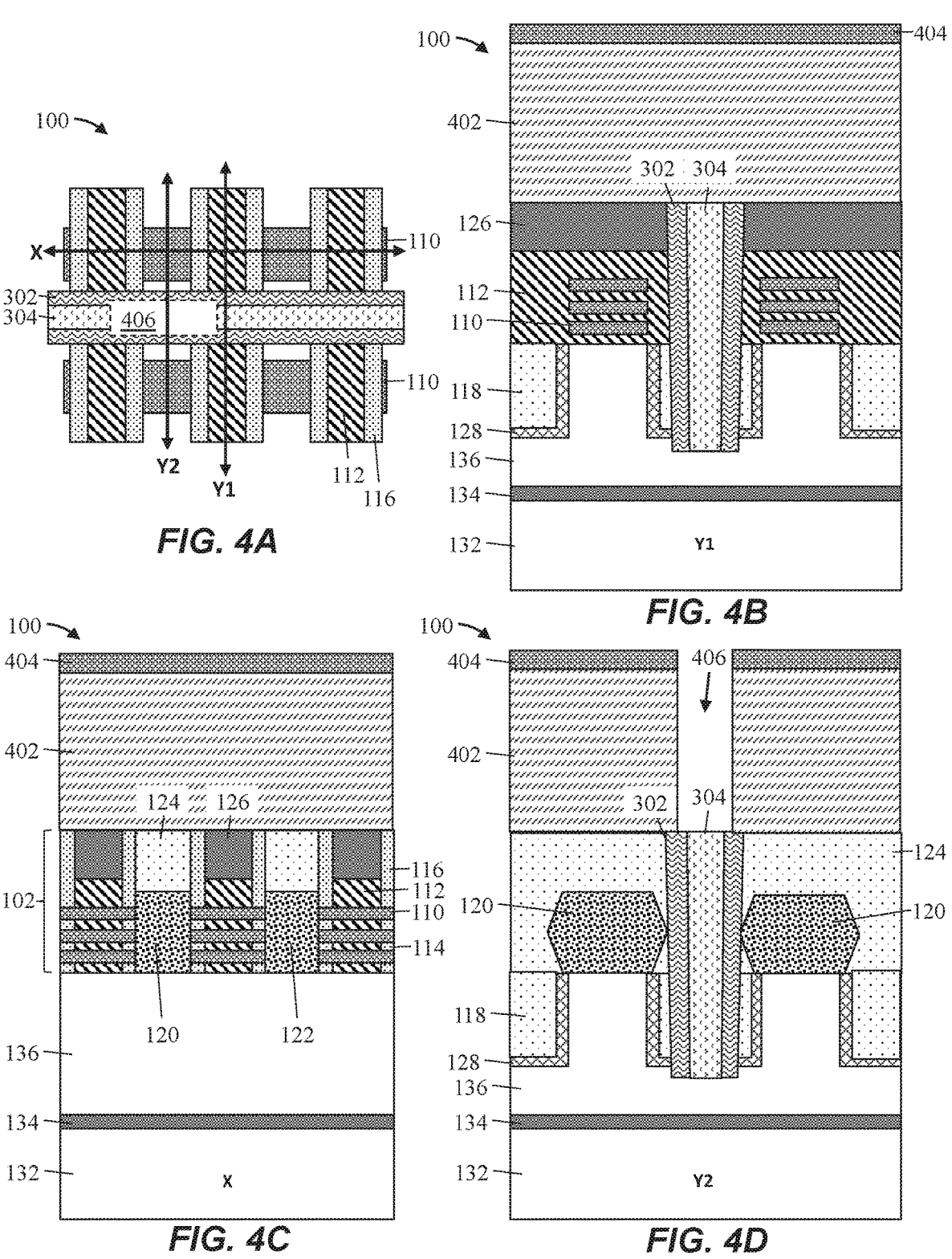
FIG. 4A depicts a top-down view of the semiconductor wafer after a processing operation according to one or more embodiments.
FIG. 4B depicts a cross-sectional view taken along the line X in FIG. 4A after the processing operation according to one or more embodiments of the invention.
FIG. 4C depicts a cross-sectional view taken along the line Y1 in FIG. 4A after the processing operation according to one or more embodiments of the invention.
FIG. 4D depicts a cross-sectional view taken along the line Y2 in FIG. 4A after the processing operation according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-endof-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another. Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

As discussed previously, a key component of the BEOL structure is the power delivery network (PDN). Backside power delivery, also referred to as a backside power delivery network (BSPDN), is a chip architecture that involves repositioning layers of the PDN from the top of the FEOL to the opposite side of the chip to free space on the front side for additional elements (e.g., more transistors). In other words, in a backside-style architecture the PDN layers are placed on the backside of the semiconductor substrate onto which the active devices have been built.

Backside-style architectures require one or more so-called backside power rails and/or backside contacts to provide electrical continuity to various structures (e.g., gate, source, and/or drain contacts) of the device. Placing these backside structures can be difficult due to poor margins and access. For example, placing non-self-aligned backside power vias to connect a backside power rail to active devices can be especially challenging due to the relatively deep RIE required to reach the active devices. Sizing must be precise as an undersized power via results in high resistance, while an oversized power via results in a large power via-to-gate capacitance. There are also concerns of backside power via-to-gate shorts. Complicating matters further, observe that conventional processes for forming the backside power via result in a relatively long and tapered backside vias where the edge to the backside power rail is smaller than the edge at the frontside structure (e.g., a source/drain contact, gate contact, etc.). To achieve a relatively wider contact surface at the backside power rail requires a larger taper at the top of the via (the portion in contact with the frontside structure), which itself can lead to shorting difficulties.

Turning now to an overview of aspects of the present invention, one or more embodiments of the invention address the above-described shortcomings by providing new fabrication methods and resulting structures for providing power vias through a wafer backside. Rather than forming a monolithic backside power via, in some embodiments, a backside power via is built over two stages. In some embodiments, a first portion of the backside power via is built pre-wafer flip during the BEOL along with other frontside structures (e.g., gate contacts, source/drain contacts, etc.). In some embodiments, a second portion of the backside power via is built post-wafer flip to land on the first portion. In some embodiments, a bi-layer gate cut region is leveraged to ensure that both the first portion and the second portion of the backside power via can be built in a self-aligned manner.

Building backside power vias over two stages (pre- and post-wafer flip) in accordance with one or more embodiments described herein offers various technical advantages over prior approaches. Notably, by providing a first portion (first stage) of the backside power via pre-wafer flip, the RIE depth can be reduced, reducing resistance, parasitic capacitance, and backside via-to-gate short risk. Moreover, the length of the contact surface between the backside power via to the backside power rail is decoupled from the length of the contact surface between the backside power via and the frontside structure. This means that the contact surface at the backside power rail can be tuned without blowing out the width of the backside power via. Other advantages are possible. For example, material selection for the backside power rail and via RIE can be selected to avoid shorts between the backside power rail and remaining exposed silicon (or other semiconductor material) post-wafer flip. As mentioned previously, a bi-layer gate cut region can ensure that both portions of the backside power via can be built in a self-aligned manner.

Turning now to a more detailed description of fabrication operations and resulting structures according to aspects of the invention, FIG. 1A depicts a top-down reference view of a semiconductor wafer 100 after an initial set of fabrication operations (e.g., through replacement high-k metal gate planarization (HKMG CMP)) have been applied as part of a method of fabricating a final semiconductor device according to one or more embodiments of the invention. FIG. 1B depicts a cross-sectional view taken along the line X (across gate in channel region) in FIG. 1A. FIG. 1C depicts a cross-sectional view taken along the line Y1 (along gate in channel region) in FIG. 1A. FIG. 1D depicts a cross-sectional view taken along the line Y2 (across channel in source/drain region) in FIG. 1A.

As shown in FIGS. 1A-1D, various FEOL structures 102 have been built in the semiconductor wafer 100. The specific examples of the FEOL structures 102 are illustrative only and are not meant to be particularly limited. For example, the FEOL structures 102 depict a nanosheet-style transistor architecture. It should be understood, however, that the nanosheet-style transistor architecture of the FEOL structures 102 is provided for ease of discussion only and that other transistor architectures (e.g., vertical tunneling transistors, planar transistors, finFETs, etc.) are included in the contemplated scope of this disclosure. Other FEOL structures can be fabricated depending on the needs of a given application, and all such configurations are within the contemplated scope of this disclosure.

In some embodiments, the semiconductor wafer 100 includes one or more nanosheets 110 (collectively, a nanosheet stack(s)) and a gate 112 formed over channel regions of the one or more nanosheets 110. As used herein, a "channel region" refers to the portion of a nanosheet of the one or more nanosheets 110 over which the gate 112 is formed, and through which current passes from source to drain in the final device.

The semiconductor wafer 100 can include various additional FEOL structures, such as, for example, inner spacers 114, gate spacers 116, a shallow trench isolation (STI) region 118, first S/D regions 120, second S/D regions 122, and interlayer dielectrics 124. In some embodiments, semiconductor wafer 100 can include additional structures, such as, for example, a gate cap 126 (also referred to as a self-aligned or SAC cap) and an STI liner 128, configured and arranged as shown.

In some embodiments, the semiconductor wafer 100 includes a substrate 132 (e.g., Si) having an etch stop layer 134 (e.g., a buried oxide layer or a SiGe epi layer) and an additional semiconductor layer 136 (e.g., Si) over the etch stop layer 134, although other substrate configurations and materials are within the contemplated scope of this disclosure. In some embodiments, the substrate (e.g., substrate 132/134/136) includes a silicon-on-insulator (SOI) structure and the substrate 132 is a bottommost substrate layer.

FIG. 2A depicts a top-down view of the semiconductor wafer 100 after a processing operation according to one or more embodiments. FIGS. 2B, 2C, and 2D depict cross-sectional views of the semiconductor wafer 100 taken along the lines X, Y1, and Y2, respectively, after the processing operation. As shown in FIGS. 2A, 2B, and 2D, a gate cut 202 (also referred to as a gate pattern or gate open) can be formed by removing portions of the gate cap 126, gate 112, STI region 118, STI liner 128, and substrate 132. The gate cut 202 can be formed using any suitable technique, such as, for example, using a wet etch, a dry etch, or a combination of sequential wet and/or dry etches.

FIG. 3A depicts a top-down view of the semiconductor wafer 100 after a processing operation according to one or more embodiments. FIGS. 3B, 3C, and 3D depict cross-sectional views of the semiconductor wafer 100 taken along the lines X, Y1, and Y2, respectively, after the processing operation. As shown in FIGS. 3A, 3B, and 3D, a bi-layer liner including a first liner 302 and a second liner 304 is formed in the gate cut 202.

The first liner 302 and the second liner 304 can be made from any suitable dielectric material, such as, for example, a low-k dielectric, a nitride, silicon nitride, silicon oxide, SiON, SiC, SiOCN, SiBCN, etc. In some embodiments, materials for the first liner 302 and the second liner 304 are selected such that the first liner 302 and the second liner 304 can be removed selective to each other (i.e., to meet etch selectivity requirements). For example, the first liner 302 can be a silicon nitride liner and the second liner 304 can be an oxide (silicon oxide) liner. In some embodiments, the first liner 302 is conformally formed in the gate cut 202 and the second liner 304 is deposited to fill remaining gaps in the gate cut 202. In some embodiments, the semiconductor wafer 100 is planarized using, for example, chemical mechanical planarization (CMP), after forming the first liner 302 and the second liner 304.

FIG. 4A depicts a top-down view of the semiconductor wafer 100 after a processing operation according to one or more embodiments. FIGS. 4B, 4C, and 4D depict cross-sectional views of the semiconductor wafer 100 taken along the lines X, Y1, and Y2, respectively, after the processing operation. As shown in FIGS. 4A, 4B, 4C, and 4D, a patterning film stack can be formed over the semiconductor wafer 100. The patterning film stack can be a bi-layer stack, a tri-layer stack, or a multilayer stack including an organic planarization layer (OPL) 402 and an antireflective coating 404. The patterning film stack can also include a topmost photoresist layer (not separately shown). Patterning layer stacks typically include OPLs because high resolution photoresists themselves often do not provide enough etch resistance for pattern transfer. OPLs are used as etch masks for pattern transfers into inorganic substrates, to fill pre-existing features, and to planarize the substrate to allow for larger patterning process windows.

The OPL 402 can be formed over a surface of the semiconductor wafer 100 using any suitable process. In some embodiments, the OPL 402 can be applied using, for example, spin coating technology. In some embodiments, the OPL 402 can include a photo-sensitive organic polymer having a light-sensitive material that, when exposed to electromagnetic (EM) radiation, is chemically altered and thus configured to be removed using a developing solvent. For example, the photo-sensitive organic polymer can be polyacrylate resin, epoxy resin, phenol resin, polyamide resin, polyimide resin, unsaturated polyester resin, polyphenylenether resin, polyphenylenesulfide resin, or benzocyclobutene (BCB). More generally, for example, the OPL 402 can include any organic polymer and a photo-active compound having a molecular structure that can attach to the molecular structure of the organic polymer. In some embodiments, the OPL 402 material is selected to be compatible with the overlying antireflective coating 404, the overlying photoresist (not shown), and the lithographic wavelength employed (i.e., ArF, KrF, etc.).

The antireflective coating 404 can be made of any suitable antireflective material, such as, for example, a low temperature oxide (LTO), SiARC, TiARC, or SiON. The antireflective coating 404 can be deposited using, for example, a spin-on process.

A photoresist (not separately shown) can include any suitable photoresist material, such as, for example, 248 nm resists, 193 nm resists, 157 nm resists, or EUV (extreme ultraviolet) resists. In some embodiments, the photoresist can be made of a light sensitive polymer, and can be deposited using any suitable resist process, such as spin-on coating.

As depicted in FIG. 4D, an OPL open 406 can be formed in the patterning film stack over and to expose portions of the first liner 302 and the second liner 304. In some embodiments, a photoresist can be patterned (opened) by exposure to a photo-lithography developing solvent to expose a surface of the antireflective coating 404. The pattern in the photoresist can be transferred to the underlying antireflective coating 404 using a dry etch process. The pattern in the antireflective coating 404 can be transferred to the underlying OPL 402 using, for example, a wet etch, a dry etch, or a combination of wet and/or dry etches.

Figures 5A, 5B, 5C, 5D:
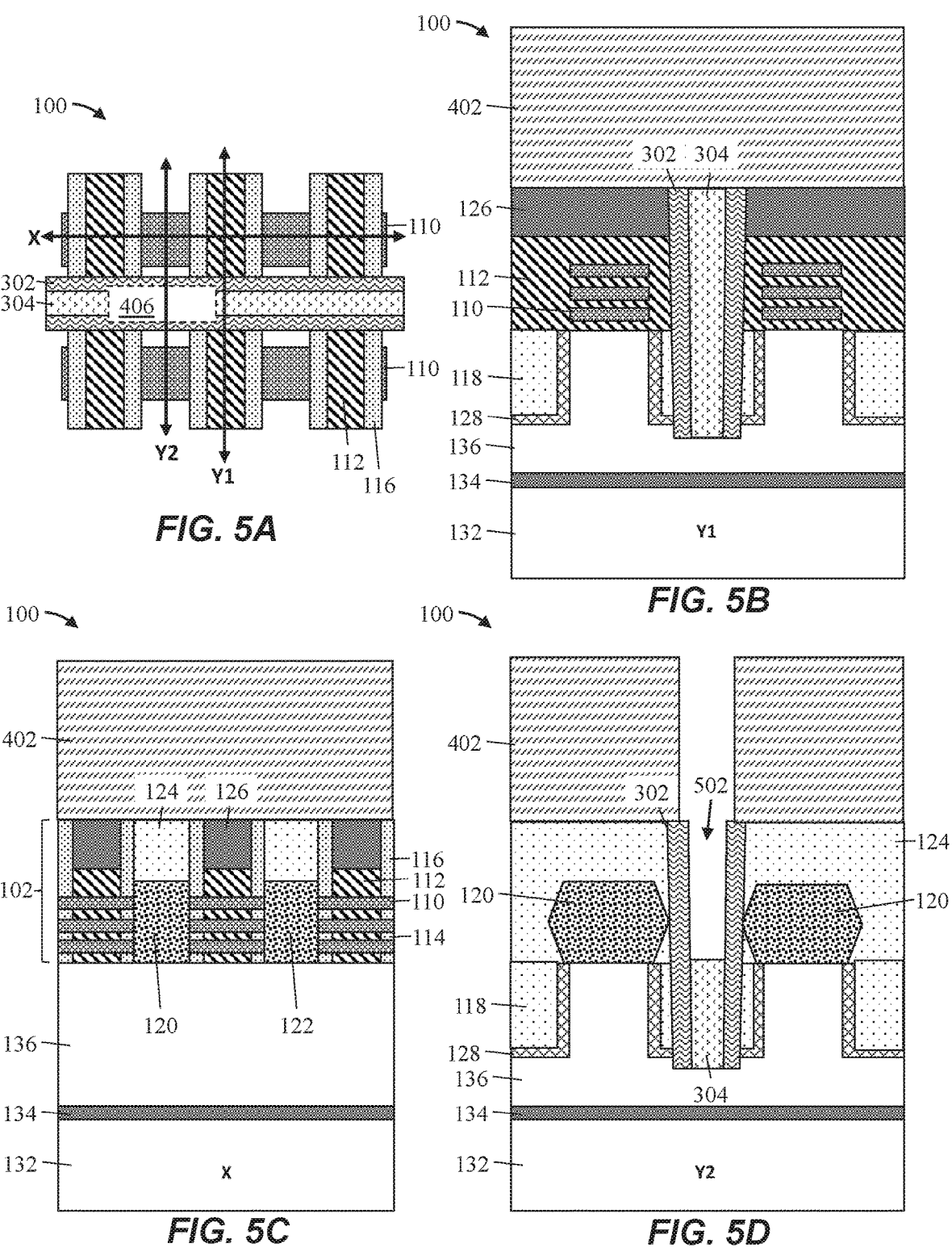
FIG. 5A depicts a top-down view of the semiconductor wafer after a processing operation according to one or more embodiments.
FIG. 5B depicts a cross-sectional view taken along the line X in FIG. 5A after the processing operation according to one or more embodiments of the invention.
FIG. 5C depicts a cross-sectional view taken along the line Y1 in FIG. 5A after the processing operation according to one or more embodiments of the invention.
FIG. 5D depicts a cross-sectional view taken along the line Y2 in FIG. 5A after the processing operation according to one or more embodiments of the invention.

FIG. 5A depicts a top-down view of the semiconductor wafer 100 after a processing operation according to one or more embodiments. FIGS. 5B, 5C, and 5D depict cross-sectional views of the semiconductor wafer 100 taken along the lines X, Y1, and Y2, respectively, after the processing operation. As shown in FIG. 5D, exposed portions of the second liner 304 can be recessed to define a first backside via trench 502. The second liner 304 can be recessed using, for example, a wet etch, a dry etch, or a combination of wet and/or dry etches. In some embodiments, the second liner 304 is recessed selective to the first liner 302. Advantageously, the first backside via trench 502 need not fully remove the second liner 304 and consequently, the removal depth (e.g., RIE depth) is relatively reduced. In some embodiments, the antireflective coating 404 is removed when forming the first backside via trench 502 (as shown).

FIG. 6A depicts a top-down view of the semiconductor wafer 100 after a processing operation according to one or more embodiments. FIGS. 6B, 6C, and 6D depict cross-sectional views of the semiconductor wafer 100 taken along the lines X, Y1, and Y2, respectively, after the processing operation. As shown in FIGS. 6A, 6B, 6C, and 6D, the OPL 402 is removed and various MOL structures can be built on the semiconductor wafer 100. The MOL structures can include, for example, various S/D contacts 602 and gate contacts 604, configured and arranged as shown. As further shown in FIG. 6D, the first backside via trench 502 can be metalized to define a first portion 606 of a backside power via. The S/D contacts 602, gate contacts 604, and first portion 606 of a backside power via can be formed using known processes. For example, contact vias and trenches can be patterned into the semiconductor wafer 100 and those vias and trenches can be filled (metalized) using known metal deposition and/or plating techniques.

Figures 7A, 7B, 7C, 7D:
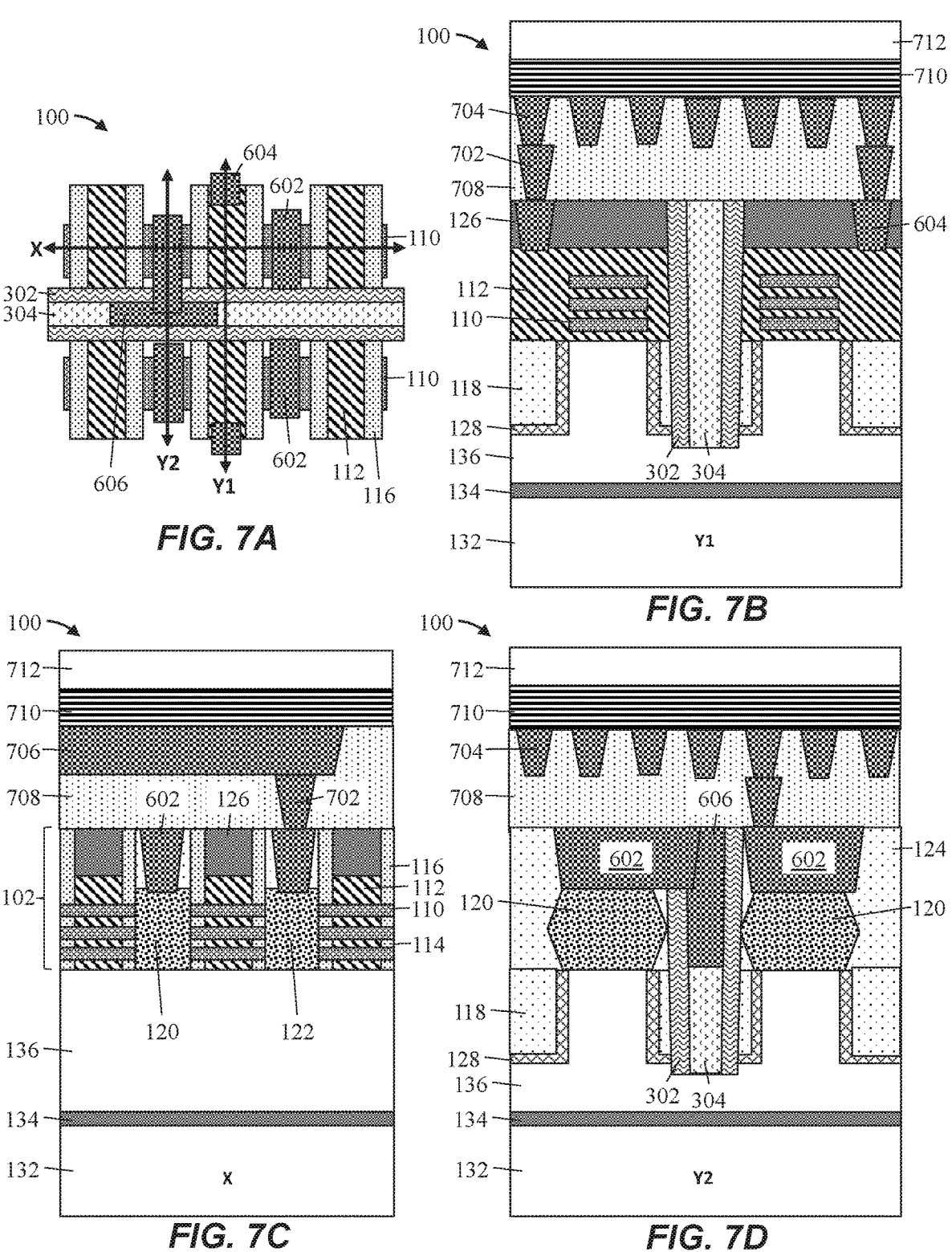
FIG. 7A depicts a top-down view of the semiconductor wafer after a processing operation according to one or more embodiments.
FIG. 7B depicts a cross-sectional view taken along the line X in FIG. 7A after the processing operation according to one or more embodiments of the invention.
FIG. 7C depicts a cross-sectional view taken along the line Y1 in FIG. 7A after the processing operation according to one or more embodiments of the invention.
FIG. 7D depicts a cross-sectional view taken along the line Y2 in FIG. 7A after the processing operation according to one or more embodiments of the invention.

FIG. 7A depicts a top-down view of the semiconductor wafer 100 after a processing operation according to one or more embodiments. FIGS. 7B, 7C, and 7D depict cross-sectional views of the semiconductor wafer 100 taken along the lines X, Y1, and Y2, respectively, after the processing operation. As shown in FIGS. 7B, 7C, and 7D, various BEOL structures are formed over the semiconductor wafer 100.

The BEOL structures are not meant to be particularly limited and can include various vias (e.g., "V0", "V1"), metal layers (also known as metal lines, e.g., "M1", "M2"), and any number of intermediate interconnects (metal levels/vias between Mx and Mx+1). For example, the BEOL structures can include vias 702 (V0 vias), vias 704 (V1 vias), and a metal layer 706 (M1 line) formed in an interlayer dielectric (ILD) 708. The BEOL structures can further include an interconnect 710 (which itself can include any number of levels of vias and lines). The BEOL structures shown are illustrative only. The semiconductor wafer 100 can include any number of interconnect layers and all such configurations are within the contemplated scope of this disclosure.

In some embodiments, a carrier wafer 712 is formed over the BEOL structures (e.g., the interconnect 710). The carrier wafer 712 can be made of a same or different material as the substrate 132/134/136, such as silicon and/or a wafer handling material.

FIG. 8A depicts a top-down view of the semiconductor wafer 100 after a processing operation according to one or more embodiments. FIGS. 8B, 8C, and 8D depict cross-sectional views of the semiconductor wafer 100 taken along the lines X, Y1, and Y2, respectively, after the processing operation. As shown in FIGS. 8B, 8C, and 8D, the substrate 132 and the etch stop layer 134 are removed and the additional semiconductor layer 136 is recessed.

In some embodiments, the semiconductor wafer 100 is flipped and the substrate 132 is removed post-wafer flip. In some embodiments, removal of the substrate 132 lands (or stops) on the etch stop layer 134. For example, the substrate 132 can be removed by grinding and/or CMP to the etch stop layer 134. Note that the orientation of the semiconductor wafer 100 shown in FIGS. 8A to 8D remains fixed for ease of discussion. In some embodiments, the etch stop layer 134 is removed after stripping off the substrate 132 to expose portions of the additional semiconductor layer 136.

In some embodiments, the exposed portions of the additional semiconductor layer 136 are then recessed during a so-called backside silicon recess. In some embodiments, portions of the additional semiconductor layer 136 are removed selective to the STI liner 128, the bi-layer liner including the first liner 302 and the second liner 304. In this manner, the underlying structures (e.g., gate, S/D epi, etc.) can be preserved without risk of inadvertent damage.

FIG. 9A depicts a top-down view of the semiconductor wafer 100 after a processing operation according to one or more embodiments. FIGS. 9B, 9C, and 9D depict cross-sectional views of the semiconductor wafer 100 taken along the lines X, Y1, and Y2, respectively, after the processing operation. As shown in FIGS. 9B, 9C, and 9D, a dielectric cap 902 is formed over the recessed surface of the additional semiconductor layer 136.

The dielectric cap 902 can be made from any suitable dielectric material, such as, for example, a low-k dielectric, a nitride, silicon nitride, silicon oxide, SiON, SiC, SiOCN, SiBCN, etc. In some embodiments, materials for the dielectric cap 902 are selected such that the second liner 304 can be removed selective to the dielectric cap 902 (see FIGS. 11B and 11D). For example, the second liner 304 can be an oxide (silicon oxide) liner and the dielectric cap 902 can be a silicon nitride cap.

Figures 10A, 10B, 10C, 10D:
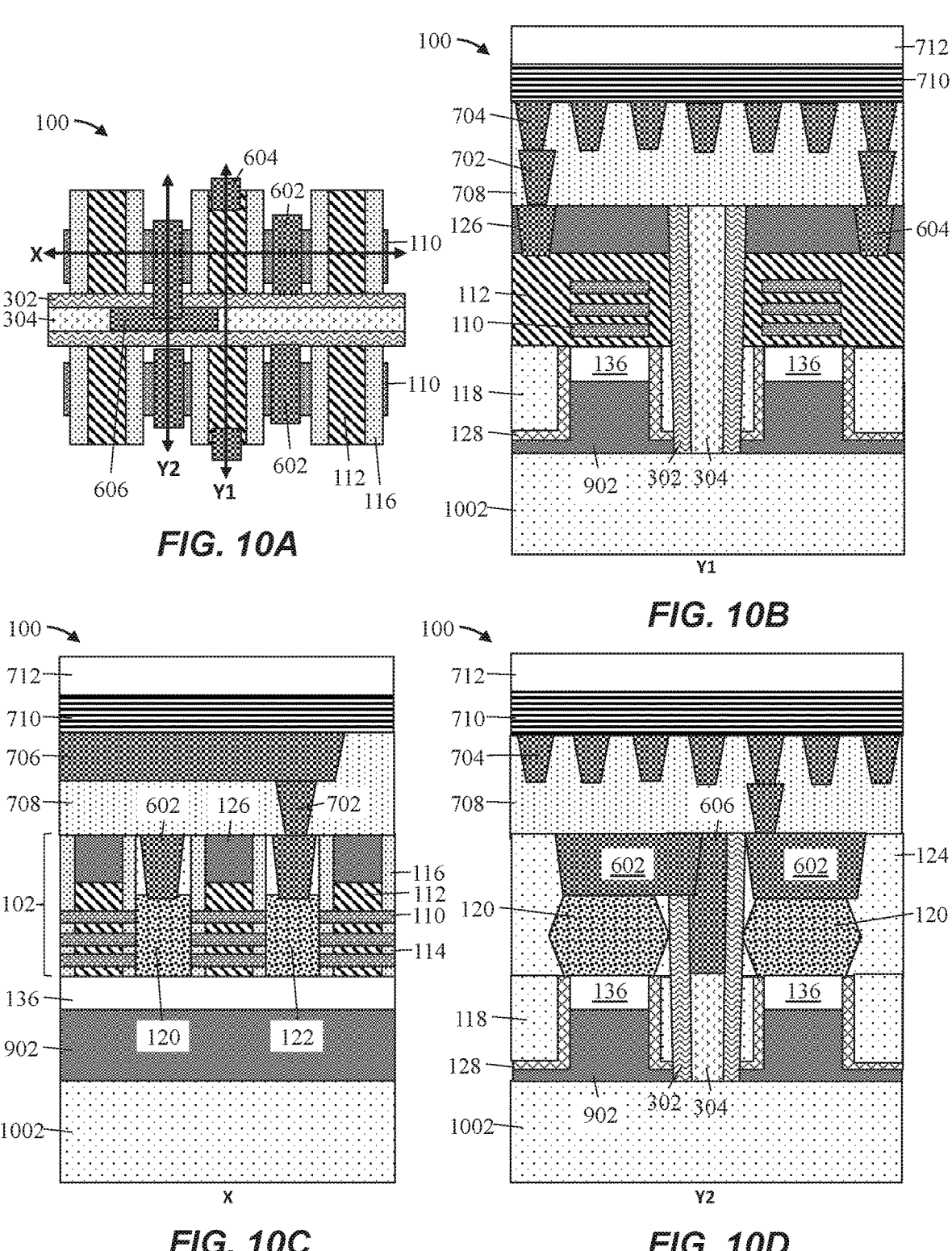
FIG. 10A depicts a top-down view of the semiconductor wafer after a processing operation according to one or more embodiments.
FIG. 10B depicts a cross-sectional view taken along the line X in FIG. 10A after the processing operation according to one or more embodiments of the invention.
FIG. 10C depicts a cross-sectional view taken along the line Y1 in FIG. 10A after the processing operation according to one or more embodiments of the invention.
FIG. 10D depicts a cross-sectional view taken along the line Y2 in FIG. 10A after the processing operation according to one or more embodiments of the invention.

FIG. 10A depicts a top-down view of the semiconductor wafer 100 after a processing operation according to one or more embodiments. FIGS. 10B, 10C, and 10D depict cross-sectional views of the semiconductor wafer 100 taken along the lines X, Y1, and Y2, respectively, after the processing operation. As shown in FIGS. 10B, 10C, and 10D, a back-side dielectric 1002 is formed over the dielectric cap 902. In some embodiments, the backside dielectric 1002 is formed by replacing portions of the removed additional semiconductor layer 136 with dielectric material.

The backside dielectric 1002 can be made from any suitable dielectric material, such as, for example, a low-k dielectric, a nitride, silicon nitride, silicon oxide, SiON, SiC, SiOCN, SiBCN, etc. In some embodiments, materials for the backside dielectric 1002 are selected such that the backside dielectric 1002 can be removed selective to the dielectric cap 902 and the first liner 302 (see FIGS. 11B and 11D). For example, the backside dielectric 1002 can be an oxide-based dielectric (silicon oxide) when the dielectric cap 902 and the first liner 302 are nitride-based dielectrics.

Figures 11A, 11B, 11C, 11D:
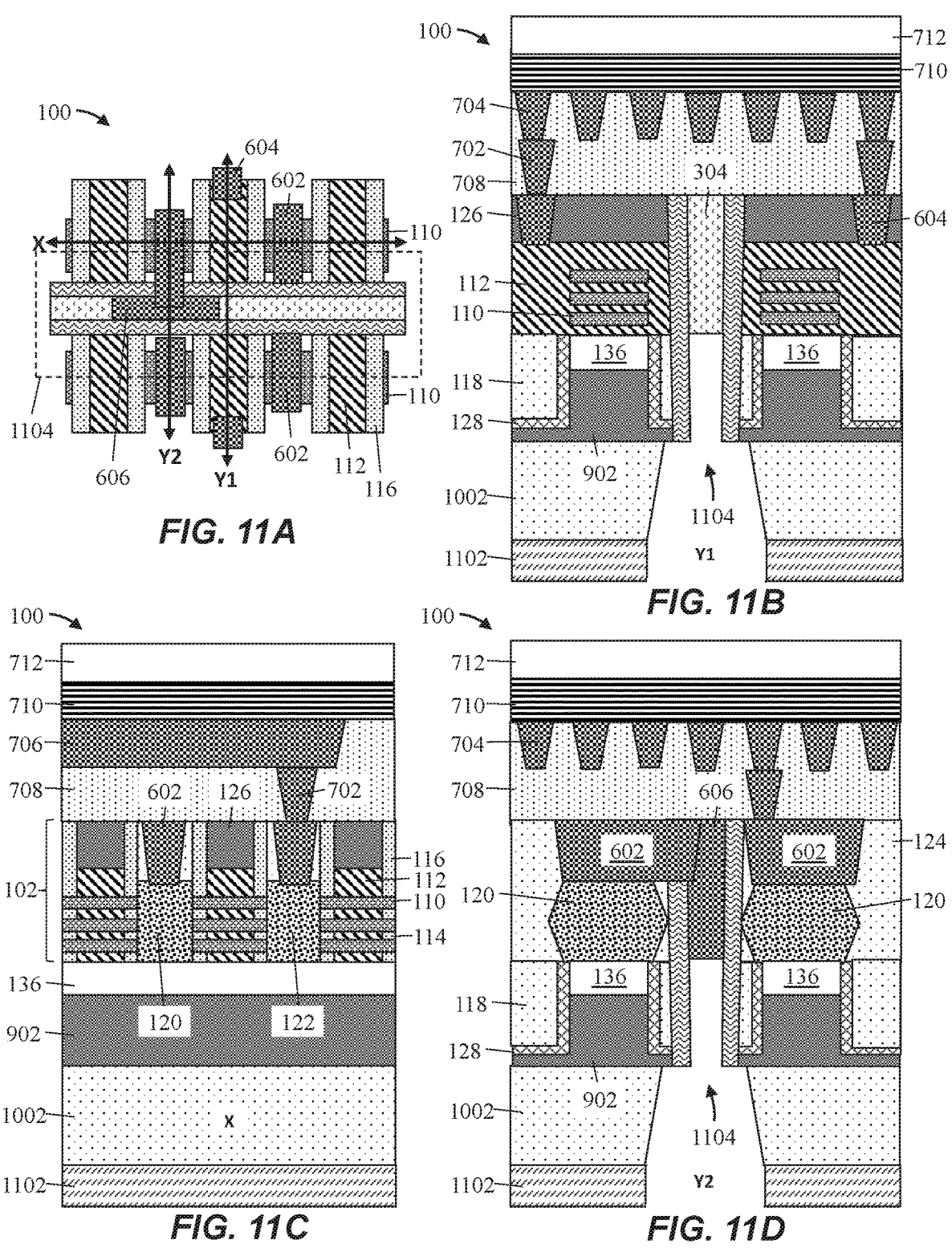
FIG. 11A depicts a top-down view of the semiconductor wafer after a processing operation according to one or more embodiments.
FIG. 11B depicts a cross-sectional view taken along the line X in FIG. 11A after the processing operation according to one or more embodiments of the invention.
FIG. 11C depicts a cross-sectional view taken along the line Y1 in FIG. 11A after the processing operation according to one or more embodiments of the invention.
FIG. 11D depicts a cross-sectional view taken along the line Y2 in FIG. 11A after the processing operation according to one or more embodiments of the invention.

FIG. 11A depicts a top-down view of the semiconductor wafer 100 after a processing operation according to one or more embodiments. FIGS. 11B, 11C, and 11D depict cross-sectional views of the semiconductor wafer 100 taken along the lines X, Y1, and Y2, respectively, after the processing operation. As shown in FIGS. 11B and 11D, a patterning film stack can be formed over the semiconductor wafer 100. The patterning film stack can be a bi-layer stack, a tri-layer stack, or a multilayer stack including an OPL 1102 formed in a similar manner as discussed with respect to the OPL 402 (optional antireflective coating and photoresist omitted for simplicity).

As depicted in FIGS. 11B and 11D, the OPL 1102 can be opened and the pattern transferred into the backside dielectric 1002 to expose a portion of the second liner 304. In some embodiments, exposed portions of the second liner 304 can be recessed (see FIG. 11B) and/or removed (see FIG. 11D) to define a second backside via trench 1104. The second liner 304 can be recessed and/or removed using, for example, a wet etch, a dry etch, or a combination of wet and/or dry etches. The patterning film stack including the OPL 1102 can be removed after forming the second backside via trench 1104.

In some embodiments, the second liner 304 is patterned selective to the first liner 302 and/or the dielectric cap 902. Advantageously, the second backside via trench 1104 will naturally self-align to the first portion 606 of a backside power via due to the etch selectivity of the second liner 304.

Figures 12A, 12B, 12C, 12D:
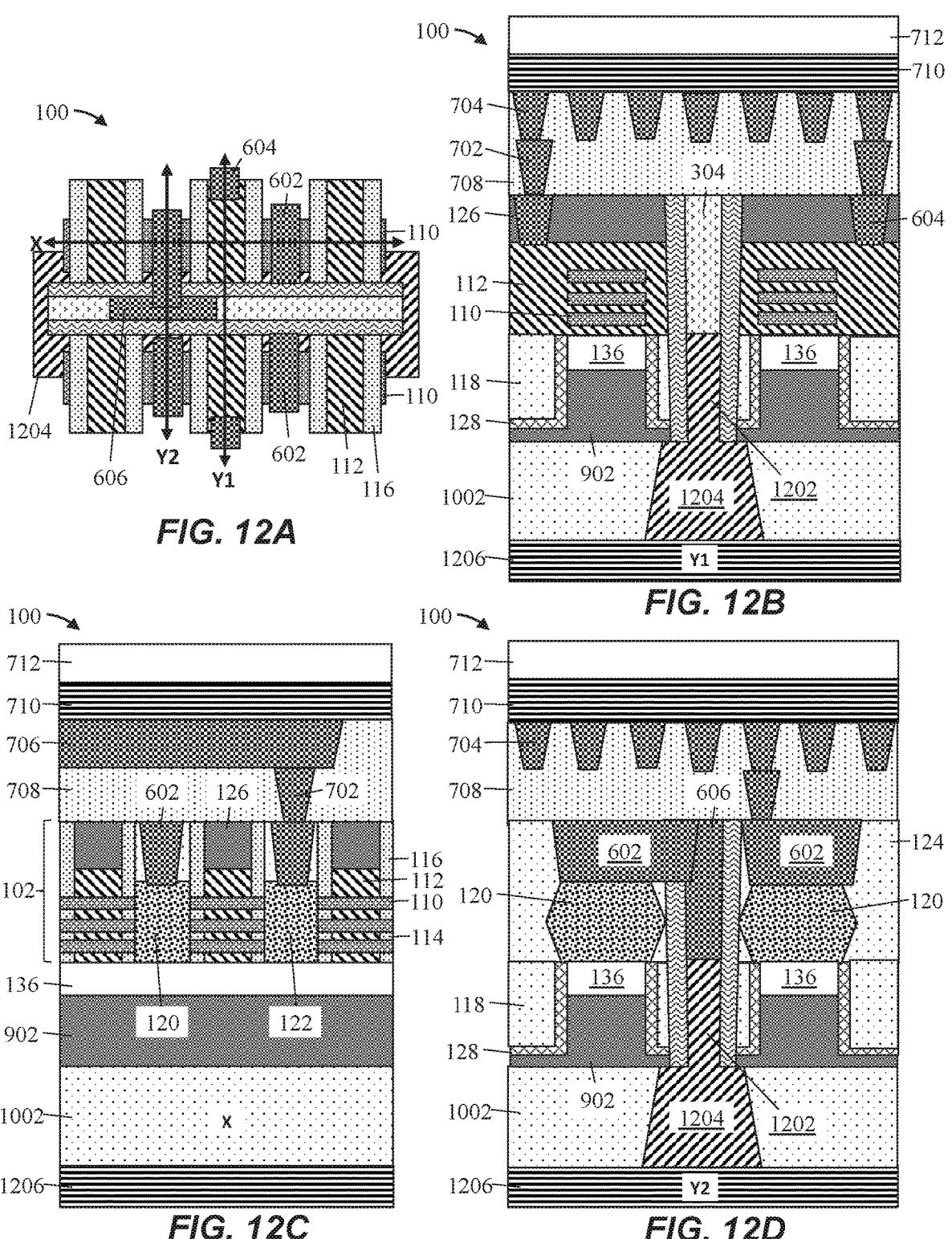
FIG. 12A depicts a top-down view of the semiconductor wafer after a processing operation according to one or more embodiments.
FIG. 12B depicts a cross-sectional view taken along the line X in FIG. 12A after the processing operation according to one or more embodiments of the invention.
FIG. 12C depicts a cross-sectional view taken along the line Y1 in FIG. 12A after the processing operation according to one or more embodiments of the invention.
FIG. 12D depicts a cross-sectional view taken along the line Y2 in FIG. 12A after the processing operation according to one or more embodiments of the invention.

FIG. 12A depicts a top-down view of the semiconductor wafer 100 after a processing operation according to one or more embodiments. FIGS. 12B, 12C, and 12D depict cross-sectional views of the semiconductor wafer 100 taken along the lines X, Y1, and Y2, respectively, after the processing operation. As shown in FIGS. 12A, 12B, and 12D, the second backside via trench 1104 can be metalized to define a second portion 1202 of a backside power via 606/1202 in a similar manner as discussed with respect to the first portion 606. Observe that portions of the second backside via trench 1104 (e.g., in the Y2 slice taken across channel in the source/drain region, see FIG. 12B), while not used to provide electrical connections, can serve as a sort of physical signature of the two-stage backside power rail metallization process described herein.

In some embodiments, a backside power rail (BSPR) 1204 is formed over the backside power via 606/1202. In some embodiments, the backside power rail 1204 is formed by metalizing remaining portions of the second backside via trench 1104.

In some embodiments, additional backside processing can include forming a backside power delivery network (BSPDN) 1206 over the semiconductor wafer 100. The backside power delivery network 1206 can include any number of conductive/metal layers, lines, and vias, and can be formed in a similar manner as the BEOL structures discussed previously, except that the backside power delivery network 1206 is formed on an opposite side of the semiconductor wafer 100. Additional backside dielectrics (omitted for clarity) can be formed before or after the backside power rail 1204 and/or the backside power delivery network 1206.

After backside processing is complete, the semiconductor wafer 100 can be finalized using known processes (e.g., additional BEOL, far back end of line (FBEOL), and packaging processes used to define a final device, including the incorporation of additional frontside and/or backside metallization layers).

FIG. 13 depicts a flow diagram illustrating a method 1300 for providing power vias through a wafer backside according to one or more embodiments of the invention. As shown at block 1302, the method includes forming a gate and a S/D region on a substrate.

At block 1304, the method includes forming a bi-layer liner in a gate cut of the gate. The bi-layer liner includes a first liner on sidewalls of the gate cut and a second liner between the first liner.

At block 1306, the method includes replacing a top portion of the second liner with a first portion of a backside power via. In some embodiments, replacing the top portion of the second liner with the first portion of the backside power via includes recessing the second liner.

At block 1308, the method includes flipping the semiconductor device.

At block 1310, the method includes replacing a bottom portion of the second liner with a second portion of the backside power via.

In some embodiments, the method further includes forming a backside power rail on the second portion of the backside power via.

In some embodiments, the method further includes recessing the substrate. In some embodiments, the method includes forming a dielectric cap on the recessed surface of the substrate. In some embodiments, the substrate is electrically isolated from the second portion of the backside power via and the backside power rail by the dielectric cap. In some embodiments, the substrate is recessed below a surface of the bi-layer liner.

In some embodiments, the method includes forming a S/D contact on the S/D region. The S/D contact is in direct contact with the first portion of the backside power via.

In some embodiments, the first liner of the bi-layer liner includes a first material and the second liner of the bi-layer liner includes a second material that can be removed selective to the first material.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of +8% or 5%, or 2% of a given value.

The phrase "selective to," such as, for example, "a first element selective to a second element," means that the first element can be etched and the second element can act as an etch stop (i.e., the second element remains).

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention of the invention, epitaxial growth and/or deposition processes can be selective to forming on semiconductor surface, and may or may not deposit material on other exposed surfaces, such as silicon dioxide or silicon nitride surfaces.

As used herein, "p-type" refers to the addition of impurities to an intrinsic semiconductor that creates deficiencies of valence electrons. In a silicon-containing substrate, examples of p-type dopants, i.e., impurities, include but are not limited to, boron, aluminum, gallium, and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising:

forming a gate and a source or drain (S/D) region on a substrate;

forming a bi-layer liner in a gate cut of the gate, the bi-layer liner comprising a first liner on sidewalls of the gate cut and a second liner between the first liner;

replacing a top portion of the second liner with a first portion of a backside power via;

flipping the semiconductor device; and replacing a bottom portion of the second liner with a second portion of the backside power via.

2. The method of claim 1, further comprising forming a backside power rail on the second portion of the backside power via.

3. The method of claim 2, further comprising recessing the substrate.

4. The method of claim 3, further comprising forming a dielectric cap on a recessed surface of the substrate, wherein the substrate is electrically isolated from the second portion of the backside power via and the backside power rail by the dielectric cap.

5. The method of claim 1, further comprising forming a S/D contact on the S/D region, the S/D contact in direct contact with the first portion of the backside power via.

6. The method of claim 1, wherein replacing the top portion of the second liner with the first portion of the backside power via comprises recessing the second liner.

7. The method of claim 1, wherein the first liner of the bi-layer liner comprises a first material and the second liner of the bi-layer liner comprises a second material that can be removed selective to the first material.

8. A semiconductor device comprising:
   a front end of line structure comprising a gate and a source or drain (S/D) region on a substrate, the front end of line structure further comprising a bi-layer liner in a gate cut of the gate, the bi-layer liner comprising a first liner on sidewalls of the gate cut and a second liner between the first liner, the second liner recessed from a bottommost surface of the first liner in a channel region of the gate cut and absent in the S/D region; and
   a back end of line structure on a backside surface of the front end of line structure, the back end of line structure comprising a second portion of the backside power via, the second portion of the backside power via extending between the first liner to contact the recessed portion of the second liner in the channel region of the gate cut.

9. The semiconductor device of claim 8, further comprising a backside power rail on the second portion of the backside power via.

10. The semiconductor device of claim 9, wherein the substrate is recessed below a surface of the bi-layer liner.

11. The semiconductor device of claim 10, further comprising a dielectric cap on a recessed surface of the substrate, wherein the substrate is electrically isolated from the second portion of the backside power via and the backside power rail by the dielectric cap.

12. The semiconductor device of claim 8, further comprising a S/D contact on the S/D region, the S/D contact in direct contact with the first portion of the backside power via.

13. The semiconductor device of claim 8, wherein a portion of the second liner is in direct contact with the second portion of the backside power via.

14. The semiconductor device of claim 8, wherein the first liner of the bi-layer liner comprises a first material and the second liner of the bi-layer liner comprises a second material that can be removed selective to the first material.

15. A semiconductor device comprising:
   a front end of line structure comprising a gate and a source or drain (S/D) region over a first surface of a substrate, the front end of line structure further comprising a first liner on sidewalls of a gate cut and a second liner between the first liner, the second liner recessed from a bottommost surface of the first liner in a channel region of the gate cut and absent in the S/D region;
   a first back end of line structure over the first surface of the substrate, the first back end of line structure comprising a S/D contact on the S/D region, the S/D contact in direct contact with the first portion of the backside power via; and
   a second back end of line structure over a second surface of the substrate opposite the first surface of the substrate, the second back end of line structure comprising a second portion of the backside power via, the second portion of the backside power via extending between the first liner to contact the recessed portion of the second liner in the channel region of the gate cut.

16. The semiconductor device of claim 15, further comprising a backside power rail on the second portion of the backside power via.

17. The semiconductor device of claim 16, wherein the substrate is recessed below a surface of first liner.

18. The semiconductor device of claim 17, further comprising a dielectric cap on a recessed surface of the substrate, wherein the substrate is electrically isolated from the second portion of the backside power via and the backside power rail by the dielectric cap.

19. The semiconductor device of claim 15, wherein a portion of the second liner is in direct contact with the second portion of the backside power via.

20. The semiconductor device of claim 15, wherein the first liner comprises a first material and the second liner comprises a second material that can be removed selective to the first material.

* * * * *